United States Patent
Chhabra et al.

(10) Patent No.: US 8,647,445 B1
(45) Date of Patent: *Feb. 11, 2014

(54) PROCESS FOR CLEANING SEMICONDUCTOR DEVICES AND/OR TOOLING DURING MANUFACTURING THEREOF

(71) Applicant: International Business Machines Corporation, Armonk, NY (US)

(72) Inventors: Vishal Chhabra, Fishkill, NY (US); John A. Fitzsimmons, Poughkeepsie, NY (US); Mahmoud Khojasteh, Poughkeepsie, NY (US); Jennifer Muncy, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/669,651

(22) Filed: Nov. 6, 2012

(51) Int. Cl.
*B08B 3/04* (2006.01)

(52) U.S. Cl.
USPC .......... 134/29; 134/6; 134/7; 134/26; 134/27; 134/28; 134/30; 134/36; 134/41; 134/42; 134/902; 510/175; 510/434; 510/435; 510/488; 510/504

(58) Field of Classification Search
USPC ............ 451/56; 510/175, 434, 435, 488, 504; 134/6, 7, 26, 27, 28, 29, 30, 36, 41, 42, 134/902
See application file for complete search history.

(56) References Cited

U.S. PATENT DOCUMENTS

| 5,876,508 | A  | * | 3/1999  | Wu et al. ............................ 134/2 |
| 6,200,910 | B1 |   | 3/2001  | O'Brien et al. |
| 6,498,131 | B1 | * | 12/2002 | Small et al. ................... 510/175 |
| 6,652,661 | B2 |   | 11/2003 | Martin |
| 6,869,487 | B1 |   | 3/2005  | Bergman |
| 7,014,552 | B1 | * | 3/2006  | Collier et al. ................... 452/56 |
| 7,235,188 | B2 |   | 6/2007  | Daviot et al. |
| 7,270,597 | B2 | * | 9/2007  | Svirchevski et al. ........... 451/56 |
| 7,314,575 | B2 |   | 1/2008  | Marumo et al. |
| 7,384,870 | B2 |   | 6/2008  | Saito et al. |
| 7,399,365 | B2 |   | 7/2008  | Aoyama et al. |
| 7,498,295 | B2 | * | 3/2009  | Fisher et al. ................... 510/175 |
| 7,919,446 | B1 | * | 4/2011  | Fresco et al. ................... 510/175 |
| 2004/0121710 | A1 | * | 6/2004 | Boyd ............................... 451/56 |
| 2005/0199264 | A1 | * | 9/2005 | Andreas ........................... 134/2 |
| 2006/0042651 | A1 |   | 3/2006 | Verhaverbeke et al. |
| 2006/0272677 | A1 |   | 12/2006 | Lee et al. |
| 2008/0287041 | A1 | * | 11/2008 | Kordic et al. ................... 451/72 |
| 2009/0137191 | A1 | * | 5/2009 | Lee ................................. 451/36 |
| 2009/0239777 | A1 | * | 9/2009 | Angst et al. ................... 510/175 |
| 2010/0105595 | A1 |   | 4/2010 | Lee |
| 2010/0261632 | A1 |   | 10/2010 | Korzenski et al. |

FOREIGN PATENT DOCUMENTS

| JP | 7097694    | 4/1995 |
| JP | 11251280   | 9/1999 |
| JP | 2006099847 | 4/2006 |

* cited by examiner

*Primary Examiner* — Bibi Carrillo
(74) *Attorney, Agent, or Firm* — Cantor Colburn LLP; Ian MacKinnon

(57) ABSTRACT

Cleaning processes for cleaning semiconductor devices or semiconductor tooling during manufacture thereof generally include contacting the semiconductor devices or semiconductor tooling with an antioxidant to form an insoluble adduct followed by solubilizing the adduct with a basic aqueous cleaning solution.

17 Claims, No Drawings

PROCESS FOR CLEANING SEMICONDUCTOR DEVICES AND/OR TOOLING DURING MANUFACTURING THEREOF

BACKGROUND

The present disclosure generally relates to semiconductor device manufacturing and, more particularly, to the cleaning and removal of residues and/or contaminants formed on the semiconductor device during manufacture.

The integrated circuit manufacturing process can generally be divided into front end of line (FEOL) and back end of line (BEOL) processing. The FEOL processes are focused on fabrication of the different devices that make up the integrated circuit, whereas BEOL processes are focused on forming metal interconnects between the different devices of the integrated circuit. In the FEOL processes, shallow trench isolation structures and gate or memory stacks are typically formed. These structures are fragile due to their increasingly small dimensions and the types of materials used to form the structures. BEOL processes may also have fragile structures such as dual damascene etched openings in low k dielectric materials or polysilicon interconnect lines. Often BEOL processing includes one or more chemical mechanical planarization (CMP) process steps, which are inherently very dirty processes.

The number of photoresist cleaning or stripping steps employed in the semiconductor manufacturing process has grown greatly in the last few years. The increasing number of ion implantation steps has contributed greatly to this increase. Current high current or high energy implant operations are the most demanding in that they require a high degree of wafer cleanliness to be obtained while minimizing or eliminating photoresist popping, surface residues, and metal contamination while requiring substantially no substrate/junction loss or oxide loss. Likewise, the semiconductor manufacturing process will typically include one or more CMP processes that typically employ abrasive slurries and rotating pads/brushes to effect surface planarization. Defect minimization during semiconductor manufacture is of great interest to the overall success as devices are scaled to smaller dimensions. For example, ceria nanoparticles are often used as the CMP slurry for next generation technology nodes because defect levels are at or below the more traditional silica-abrasive slurries and also because very low concentrations can effectively be used, which translates to lower levels of contamination. However, the semiconductor devices as well as the CMP pads/brushes are often contaminated with particles of ceria that require removal for successful and efficient device manufacture.

Because of the extraordinarily high levels of cleanliness that are generally required during the fabrication of semiconductor substrates, multiple cleaning steps are typically required to remove impurities from the surfaces of the substrates before subsequent processing. A typical surface preparation procedure may include etch, clean, rinse and dry steps. During a typical cleaning step, the substrates may be exposed to a cleaning solution that can include mixtures of hydrogen peroxide and ammonium hydroxide, and/or hydrochloric acid, and/or sulfuric acid, and/or hydrofluoric acid with a surfactant. These solutions are commonly referred by those in the art to as SC1, SC2, HPM, APM and IMEC cleaning solutions. After cleaning, the substrates are rinsed using ultrapure water and then dried using one of several known drying processes. In some instances, the cleaning solutions may be in combination with acoustical cleaning methods, e.g., ultrasonics, megasonics, and the like.

In various advanced development processes required for semiconductor device manufacture, either rare earth metals or transition metals are required to be selectively removed in the presence of very similar metallurgy. In addition, reactive ions etch (RIE) or CMP processes may leave modified residues related to these rare earth or transition metallurgy. In FEOL processes, the typical cleaning chemistries are not selective enough to differentiate between some of these residues that must be removed or metals and the metals required to remain. For example, SC1 is commonly used to remove FEOL residue, but is also known to attack TiN surfaces. TiN is used as a component of some metal gate structures and any loss of TiN in these metal gate structures can result in an undesirable decrease or change in device performance.

Accordingly, it would be desirable to have a process and chemistry that is capable of removing undesired residue without producing a undesired decrease or change in device performance.

BRIEF SUMMARY

Disclosed herein are compositions and processes for cleaning semiconductor devices and/or semiconductor tooling. In one embodiment, a process for cleaning a semiconductor device or tooling during manufacture thereof comprises contacting the semiconductor device or tooling with an aqueous solution comprising at least one antioxidant for a period of time and at a temperature effective to form an insoluble adduct with residues from the semiconductor device or tooling; and contacting the adduct with an aqueous solution comprising at least one base for a period of time and at a temperature effective to solubilize the adduct.

In another embodiment, a process for removing ceria particles from a chemical mechanical processing tool comprises forming an aqueous insoluble adduct of an antioxidant and the ceria particles; and solubilizing the adduct in a basic aqueous solution having a pH greater than 7 to effect removal of the ceria particles from the chemical mechanical processing tool.

The disclosure may be understood more readily by reference to the following detailed description of the various features of the disclosure and the examples included therein.

DETAILED DESCRIPTION

Disclosed herein are aqueous cleaning processes and compositions for cleaning substrates during semiconductor manufacturing and/or semiconductor tooling surfaces. The processes generally include sequentially exposing the substrate to a first aqueous solution of an antioxidant compound and then to a second solution that is a basic aqueous solution. It is understood that the first and second aqueous solutions by definition uses purified water as the solution solvent. Additionally, the antioxidant compound can be selected to possess both antioxidant and reductant properties. Surprisingly, while separate exposure of the contaminate to either the antioxidant aqueous solution or the basic aqueous solution by themselves results in insoluble precipitates, the sequential process as described herein results in the dissolution and/or complexation solubilization of the undesired contaminate. Thus, this treatment in a sequence of solutions advantageously results in the removal of our undesired contamination. Our compositions, processes and process sequencing provide effective removal of particles and residues while not damaging underlying material in contact therewith during processing such as, but not limited to, Si, $SiO_2$, TEOS, $Si_3N_4$, TiN, TaN, TaAlN, TiAlN, and the like. Likewise, these aqueous cleaning compositions, processes and process sequencing can be utilized to effectively clean the semiconductor tooling associated with semiconductor manufacture. For example, the aqueous cleaning processes and compositions can be used to remove rare earth lanthanides such as ceria particles that may be entrained in the brushes and/or pads used in chemical mechanical processing to effect surface planarization. The process generally includes forming an insoluble adduct with the ceria particles followed by solubilizing the adduct in the basic solution. This result is particularly surprising and unexpected since residues such as ceria are generally known for its insolubility in basic solutions and the adduct resulting in a treatment with an antioxidant/reductant in our observation is also often insoluble before a subsequent treatment with our basic aqueous solution. Moreover, it has generally been found that the pretreatment with an antioxidant/reductant aqueous solution followed by a treatment with a basic cleaning solution as described herein provides improved cleaning in those environments where acidic based cleaning solutions produces poor results.

As used herein, the terms residues and particles generally refer to post ash, post etch, and post CMP materials and may byproducts thereof that may be formed on the surfaces when forming the device structure and tooling surfaces. For example, post CMP residue generally refers to particles from the polishing slurry, e.g., ceria containing particles, silica containing particles, and the like; chemicals present in the slurry; reaction byproducts of the polishing slurry; carbon rich particles; polishing pad particles; brush deloading particles; tooling materials of construction particles; copper; copper oxides; copper containing materials; aluminum; aluminum oxides; aluminum containing materials; organic residues; and any other materials that are byproducts of the CMP process. The term "antioxidant/reductant" generally refers to compounds having both antioxidant and reductant properties.

While not wanting to be bound by theory, it is believed the antioxidant in the aqueous solution first produces an insoluble second compound that is an adduct of the antioxidant and the contaminate that is to be removed. Once formed, the adduct has been found to be soluble in a subsequent treatment with a basic solution. Thus, the process generally includes a two step approach. In the first step, undesired material, e.g., ceria, that is to be removed from the substrate is treated with a reducing agent (i.e., antioxidant) such as an aqueous solution of 2-10% ascorbic acid to from an insoluble adduct of the reducing agent and the undesired material. In the second step, the adduct formed in the first step is solubilized upon treatment with a basic solution such as an aqueous amine solution. Thus, this first cleaning composition provides antioxidant/reductant properties, i.e., inhibits oxidation and may additionally provide a reducing environment promoting a valence change of the metal ion; as well as, potentially enabling a ligand effect that results in formation of a second insoluble compound (i.e., adduct) and the subsequent treatment with a basic aqueous solution dissolves this second compound. The overall effect of this sequential treatment is a significant and unexpected cleaning action.

Exemplary reducing agents/antioxidants include ascorbic acid, oxalic acid, formic acid, citric acid, lactic acid, erythorbic acid, derivatives, and mixtures thereof. In one embodiment, the antioxidant is in the aqueous cleaning solution in an amount within a range of 0.5% to 10% weight by weight (w/w), and in other embodiments, within a range of 1 to 5% (w/w), and in still other embodiments, within a range of 1 to 3% (w/w).

The basic solution has a pH greater than 7; in other embodiments, the basic aqueous cleaning solution has a pH greater than 8 and in still other embodiments, the basic solution has a pH greater than 9, and in yet other embodiments, basic solution has a pH greater than 10. While pH may be adjusted using simple base addition, e.g., alkali metal hydroxides, we have also found that an amine or a single organic base or polybasic approach results in improved cleaning and solubility action. This may be due in some part to the additional ligand action of amine bases with the adduct. For example, it has been unexpectedly discovered that an aqueous solution including one or more of the organic base such as 5 to 15% by weight monoethanolamine, 2 to 10% by weight tetramethylguanidine, and 2 to 5% by weight tetramethylammonium hydroxide, wherein the weight percentages by weight are based on the total weight of the composition, provides the cleaning action and ceria adduct solubility desired without the undesirable attack or other undesired actions on support/substrate structures that must remain undamaged. A basic pH is generally preferred because the residue can be thoroughly removed without damaging the underlying structure and solubility of the antioxidant and/or the antioxidant residue complex is generally enhanced. The pH may be measured by using a known pH meter or other techniques generally suitable to measure pH within the suggested pH range that do not have interference in measurement of a basic organic solution.

With regard to the use of amines such as polybasic amines or mixtures of basic amines, it is believed that these materials may offer an advantage of enhanced solubility of ceria adduct compounds over a simple single basic solution. It is possible that the complex structures of these basic compounds may conjugate with the ceria adduct prior formed in the reducing environment and enhance the intrinsic solubility of this ceria adduct into basic solution. In a polybasic system such as we describe, these multiple ligand structures may enable a synergistic effect that may not be afforded in a single basic non-amine system. For example, by adjusting the pH to a specified pH within the region of pH-8-12 the partial dissociation of stronger basic components within a polybasic system may be controlled to afford enhanced solubility of resultant ceria complexes.

Suitable bases are water soluble and generally include at least one base having a pKa greater than 9 in most embodiments, a pKa greater than 9.8 is other embodiments, and a pKa greater than 13.6 in still other embodiments. Exemplary bases include, without limitation, monobasic amines such as ethanolamine; polybasic amines such as guanidine; quaternary ammonium compounds such as tetramethyl ammonium hydroxide; alkali and alkaline earth metal hydroxides such as sodium hydroxide, ammonium hydroxide, calcium hydroxide, and the like; mixtures thereof, and the like. In one embodiment, the base or combination of basic components (mixture of one or more bases) in the aqueous cleaning solution in an amount within a range of 0.1 to 50% weight by weight (w/w), and in other embodiments, within a range of 1 to 25 (w/w), and in still other embodiments, within a range of 5 to 20% (w/w).

Exemplary guanidine compounds are of the general formula (I):

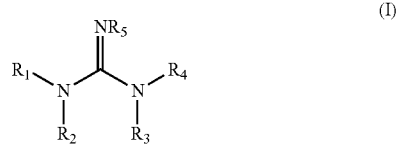

wherein $R_1$-$R_5$ independently represents a hydrogen atom, an alkyl group and/or an aralkyl group having 1 to 12 carbon atoms. In one embodiment, the guanidine is tetramethyl guanidine.

Exemplary ethanolamines include, but art not intended to be limited to, monoethanolamine, diethanolamine, triethanolamine, mixtures thereof, and the like.

An example of suitable quaternary ammonium compounds, which may also function as a surfactant includes compounds represented by general formula (II):

wherein $X^-$ represents a hydroxide ion, a chlorine ion, a bromine ion, sulfate ion or a nitrate ion; $R_1$ to $R_4$ independently represents an alkyl group and/or an aralkyl group having 1 to 24 carbon atoms.

Non-limiting examples of the compound represented by general formula (II) include tetra-methyl-ammonium hydroxide (TMAH), Tetra-ethyl-ammonium hydroxide (TEAH), Tetra-propyl-ammonium hydroxide (TPAH), Tetra-butyl-ammonium hydroxide (TBAH), and various combinations of mixed alkyl and arial R groups that need not be symmetrical in arrangement or composition (i.e. dimethyl-butyl-ethyl-ammonium hydroxide (DMBEAH)), and the like. The counter anion of these illustrated compounds is preferred as a hydroxyl ion, but it is understood that in a basic solution other counter ions not limited to hydroxyl ion such as chloride ion, bromine ion, or nitrate ion would result in providing the correct cation for the overall basic system.

The cleaning solution is an aqueous solution, wherein the water component can be deionized water. The aqueous cleaning solution can be free of any other solvents. Additionally, the aqueous cleaning solution can provide effective cleaning while not damaging underlying material in contact therewith during processing.

Optionally, the aqueous cleaning solutions may further contain a surfactant, a chelating agent, a pH buffer, mixtures thereof, and the like.

Exemplary surfactants that may be used include a nonionic surfactant, an anionic surfactant, a cationic surfactant, an ampholytic surfactant, and combinations thereof. The surfactant improves residue removal by effectively minimizing agglomeration and re-deposition of particles/residues from substrates, tooling surfaces, and solutions.

Examples of the nonionic surfactant that may be used include polyalkylene oxide alkyl phenyl ether surfactants, polyalkylene oxide alkyl ether surfactants, polyethylene oxide-polypropylene oxide block copolymer surfactants, polyoxyalkylene distyrenated phenyl ether surfactants, polyalkylene tribenzyl phenyl ether surfactants and acetylene polyalkylene oxide surfactants. Exemplary polyalkylene oxide (hereinafter abbreviated as "PAO") alkyl ether surfactant include, without limitation, PAO decyl ether, PAO lauryl ether, PAO tridecyl ether, PAO alkylene decyl ether, PAO sorbitan monolaurate, PAO sorbitan monooleate, PAO sorbitan monostearate, polyethylene oxide sorbitol tetraoleate, PAO alkylamine, and PAO acetylene glycol, mixtures thereof, and the like.

A cationic surfactant can also be used in the present disclosure and has been found to provide an increase in the removability of the residues and the resistance to corrosion of the substrate and the dielectric film. Preferred examples of the cationic surfactant include a quaternary ammonium salt surfactant.

Additionally, anionic surfactant agents have been found to suitable for use in the basic aqueous cleaning solutions. Any anionic surfactant used in the present formulations preferably is within EPA guidelines and functions as a surfactant/dispersant within the formulation pH range.

The surfactant is incorporated in the aqueous cleaning solution in an amount of preferably 0.0001 to 5 wt % and more preferably 0.0001 to 1 wt % with respect to the total weight of the aqueous cleaning solution. The addition of the surfactant to the aqueous cleaning solution enables viscosity to be adjusted to improve the wettability of the liquid with respect to the object to be cleaned. In general, such surfactants are commercially available. These surfactants may be used singly or in combination of two or more. Advantageously, residue removal is generally improved form some applications relative cleaning solutions without the surfactant(s). In some instances, the presence of an amine based surfactant may provide a synergistic effect. It is understood that in some cases the choice of basic organic additive and surfactant agent may be a common compound, in these cases the concentration of this additive takes into account both objectives and the concentration might not be limited by the upper limitation boundary for surfactant incorporation.

As noted above, the aqueous cleaning solution may further include a chelating agent, which can enhance removal of metal ions, for example. Examples of a suitable chelating agent include a group of aminopolycarboxylic acid salts such as, but not limited to, ethylenediaminetetraacetate (EDTA), diethylenetriaminepentaacetate (DTPA), 1,2-cyclohexylene-aminotetraacetic acid (CDTA), hydroxyethylethylenediaminetriacetate (HEDTA), dihydroxyethylethylenediaminetetraacetate (DHEDDA), nitrilo triacetate (NTA), hydroxyethyliminodiacetate (HIDA), β-alanine diacetate, aspartic acid diacetate, methylglycine diacetate, iminodisuccinate, serine diacetate, hydroxyiminodisuccinate, dihydroxyethylglycine salt, aspartate, glutamate, and the like; a group of hydroxycarboxylic acid salts such as, but not limited to, hydroxyacetate, tartrate, citrate, gluconate, and the like; a group of cyclocarboxylic acid salts such as, but not limited to, pyromellitate, benzopolycarboxylate, cyclopentane tetracarboxylate, and the like; a group of ether carboxylic acid salts such as, but not limited to, carboxymethyl tartronate, carboxymethyloxy succinate, oxydisuccinate, tartaric acid monosuccinate, tartaric acid disuccinate, and the like; a group of other carboxylic acid salts such as, but not limited to, maleic acid derivative, oxalate, and the like; a group of organic carboxylic acid (salt) polymers such as, but not limited to, acrylic polymers and copolymers (such as acrylic acid-allyl alcohol copolymer, acrylic acid-maleic acid copolymer, hydroxyacrylic acid polymer, polysaccharide-acrylic acid copolymer, and the like; a group of polyvalent carboxylic acid polymers and copolymers such as, but not limited to, polymers and copolymers of monomers such as maleic acid, itaconic acid, fumaric acid, tetramethylene-1,2-dicarboxylic acid, succinic acid, aspartic acid and glutamic acid, and the like; glyoxylic acid polymers; a group of polysaccharides such as, but not limited to, starch, cellulose, amylose, pectin, carboxymethyl cellulose, and the like; a group of phosphonic acid salts such as, but not limited to, methyl diphosphonic acid salt, aminotrismethylene phosphonic acid salt, ethylidene diphosphonic acid salt, 1-hydroxyethylidene-1,1-diphosphonic acid salt, ethylaminobismethylene phosphonic acid salt, ethylenediaminebismethylene phosphonic acid salt, ethylenediaminetetramethylene phosphonic acid salt, hexamethylenediaminetetramethylene phosphonic acid, propylenediaminetetramethylene phosphonic acid salt, diethylenetriaminepentamethylene phosphonic acid salt, triethylenetetraminehexamethylene phosphonic acid salt, tetraethylenepentamineheptamethylene phosphonic acid salt, and the like; dimercaporal (BAL); various combinations thereof; and the like.

Exemplary salts of these compounds include ammonium salts and salts of alkanolamines (such as monoethanolamine and triethanolamine). These may be used singly or in combination of two or more.

The chelating agent is preferably used in the aqueous cleaning solution at a concentration of 0 to 10 wt % with respect to the total weight of the aqueous cleaning solution.

Exemplary optional pH buffering agents include, but are not limited to, hydroxides, quaternary ammonium hydroxides, glycines, hydrogen phthalates, acetates, oxalates, carbonates, carbamates, citrates, methyl diethanolamine (MDEA), salicylic acid, boric acid, sulfosalicylic acid, ethane-1-hydroxy-1,1-diphosphonic acid (HEDP), sulfamic acid, sulfonic acids, choline hydroxide, monoethanolamine, acetylacetone, and combinations thereof.

The process for cleaning the semiconductor device and/or tooling during manufacture generally includes contacting the sequence of aqueous cleaning solutions with the semiconductor device and/or tooling to be cleaned. The type of contact is not intended to be limited and may include immersion, dipping, spraying, spin coating, combinations thereof, and the like. The cleaning step may be repeated as may be desired for different applications. The temperature of the aqueous cleaning solutions can be within a range from about 10° C. to about 100° C. in most embodiments, with a temperature within a range of 15° C. to 80° C. in other embodiments, and a temperature of 20 to 50° C. in still other embodiments.

The period of time for which the cleaning solutions contact the semiconductor device will generally depend on the preceding manufacturing step. Typically, the period of time will range from about 10 seconds to about 60 minutes in most embodiments, with a period of time within a range of about 10 seconds to about 30 minutes in other embodiments, and with a period of time within a range of about 1 minute to about 15 minutes in still other embodiments.

The present process can be used in individually or in combination with one or more other cleaning processes such as an SC1 process that generally includes an ammonium hydroxide/hydrogen peroxide cleaning solution. If such a combination is used, the order of performance is not intended to be limited to any particular order. Likewise, where appropriate, the present process can be used in combination with acoustical and/or mechanical energy.

By way of example, the aqueous cleaning solution sequence and process can be used to clean the polishing pads/brushes used during chemical mechanical planarization (CMP). A CMP system typically includes components for handling and polishing the semiconductor substrates. Such components can include an orbital pad. In operation, the pad is put in motion and then a slurry material is applied and spread over the surface of the pad. Slurries typically used for CMP can include rare earth elements in the lanthanide series such as ceria in the form of nanoparticles to effect planarization. Once the pad is rotating at the desired speed, the semiconductor substrate is placed in contact with the pad. The substrate is then sent to be cleaned in a substrate cleaning system. It is important to clean the substrate after CMP because particles, particulates and residues can remain on the substrate. These residues can cause damage to the semiconductor substrate during subsequent processing.

Better cleaning in the substrate cleaning system can be achieved by improving the processes used in the CMP. In this regard, pad conditioning is often performed to remove excess slurry and residue build-up. Advantageously, it has been found that the sequence of pretreatment with an antioxidant/reductant followed by a treatment with basic aqueous cleaning solution effectively removed and/or solubilized ceria deposits from the pad.

The following examples are presented for illustrative purposes only, and are not intended to limit the scope of the invention.

In these examples, an insoluble adduct of ceria and antioxidant was first formed followed by dissolution in a basic solution. In one example, 1.0 gram (g) of a yellow solid ceria precipitate was added to 50 milliliters (ml) of a 5% (w/w) ascorbic acid aqueous solution. A darker colored precipitate, i.e., an insoluble ceria-ascorbic acid adduct, was formed. The ceria-ascorbic acid adduct was isolated and then readily dissolved in a number of basic solutions as described below.

The ceria-ascorbic acid adduct (0.1 g) was added to 10 ml of an aqueous solution including 5% by weight of monoethanol amine (MEA). The adduct was observed to become visibly dissolved upon agitation. Further experimental data indicated that the ceria-ascorbic acid adduct was soluble in a range of MEA concentrations from 2.5 to 15% by weight.

The ceria-ascorbic acid adduct (0.1 g) was added to 10 ml of an aqueous solution including 2.5% by weight of tetramethylammonium hydroxide (TMAH). The adduct was observed to become visibly dissolved upon agitation. Further experimental data indicated that the ceria-ascorbic acid adduct was soluble in a range of TMAH concentrations from 1.5 to 5% by weight.

The ceria-ascorbic acid adduct (0.1 g) was added to 10 ml of an aqueous solution including 5% by weight of tetramethylammonium guanidine hydroxide (TMGH). The adduct was observed to become visibly dissolved upon agitation. Further experimental data indicated that the ceria-ascorbic acid adduct was soluble in a range of TMGH concentration from 2.5 to 7.5% by weight.

The ceria-ascorbic acid adduct (0.1 g) was added to 10 ml of an aqueous solution including 5% by weight of MEA and 5% by weight TMGH. The adduct was observed to become visibly dissolved upon agitation.

The ceria-ascorbic acid adduct (0.1 g) was added to 10 ml of an aqueous solution including 2.5% by weight of TMAH and 5% by weight TMGH. The adduct was observed to become visibly dissolved upon agitation.

The ceria-ascorbic acid adduct (0.1 g) was added to 10 ml of an aqueous solution including 5% by weight of MEA and 2.5% by weight TMGH. The adduct was observed to become visibly dissolved upon agitation.

The ceria-ascorbic acid adduct (0.1 g) was added to 10 ml of an aqueous solution including 10% by weight of MEA and 1.5% by weight TMAH. The adduct was observed to become visibly dissolved upon agitation.

The ceria-ascorbic acid adduct (0.1 g) was added to 10 ml of an aqueous solution including 7.5% by weight of TMGH and 5% by weight TMAH. The adduct was observed to become visibly dissolved upon agitation.

The ceria-ascorbic acid adduct (0.1 g) was added to 10 ml of an aqueous solution including 5% by weight of TMGH, 2.5% by weight of TMAH and 5% by weight MEA. The adduct was observed to become visibly dissolved upon agitation.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A two-step process for cleaning a semiconductor device or tooling during manufacture thereof, the process comprising:
    a first step of contacting the semiconductor device or tooling with a first aqueous solution consisting essentially of at least one antioxidant compound for a period of time and at a temperature effective to form the insoluble adduct with a residue from the semiconductor device or tooling, wherein the first aqueous solution forms the insoluble adduct of the residue and the at least one antioxidant compound; and
    a second step of contacting the insoluble adduct with a second aqueous solution consisting essentially of at least one base for a period of time and at a temperature effective to solubilize and remove the adduct, thereby cleaning the semiconductor device or tooling, wherein the first and second aqueous solutions are different.

2. The process of claim 1, wherein the at least one antioxidant compound comprises ascorbic acid, citric acid, lactic acid, erythorbic acid, and mixtures thereof.

3. The process of claim 1, wherein the at least one base comprises a monobasic amine, a polybasic amine, a quaternary ammonium salt compound, a hydroxide, and mixtures thereof.

4. The process of claim 1, wherein the period of time will range from about 10 seconds to about 60 minutes and the temperature from 10° C. to 100° C.

5. The process of claim 1, wherein the residue comprises compounds containing a rare earth element of the lanthanide series.

6. The process of claim 1, wherein the semiconductor tool is a chemical mechanical planarization pad.

7. The process of claim 1, wherein the at least one antioxidant compound is ascorbic acid in an amount from 0.5 to 10% (w/w), and wherein contacting the adduct with the second aqueous solution is at a pH greater than 9.

8. The process of claim 1, wherein the first and/or the second aqueous cleaning solution further comprises a surfactant, a pH buffer, a chelating agent, or mixtures thereof.

9. The process of claim 5, wherein the rare earth element is ceria.

10. The process of claim 8, wherein the surfactant comprises a quaternary ammonium salt surfactant, a water soluble perfluorocarboxylic acid salt, a perfluorocarboxylic acid sulfate salt, a quaternary or ammonium heptafluorobutyric acid salt, heptafluorobutyric sulfate salt, or mixtures thereof.

11. A two-step process for removing ceria particles from a chemical mechanical processing tool, the process comprising:
    a first step of forming an aqueous insoluble adduct of an antioxidant compound and the ceria particles by contacting the chemical mechanical processing tool with a first aqueous solution consisting essentially of the antioxidant compound; and
    a second step of solubilizing the aqueous insoluble adduct by contacting the insoluble adduct with a basic aqueous solution consisting essentially of a basic compound in an amount effective to provide the basic aqueous solution with a pH greater than 7 to effect removal of the ceria particles from the chemical mechanical processing tool, wherein the first aqueous solution and the basic aqueous solution are different.

12. The process of claim 11, wherein the adduct comprises ascorbic acid and ceria particles.

13. The process of claim 11, wherein the chemical mechanical processing tool is a pad or brush.

14. The process of claim 11, wherein the basic aqueous solution comprises a monobasic amine, a polybasic amine, a quaternary ammonium salt compound, a hydroxide, and mixtures thereof and water.

15. The process of claim 11, wherein the antioxidant compound comprises ascorbic acid, oxalic acid, formic acid, citric acid, lactic acid, erythorbic acid, and mixtures thereof.

16. The process of claim 11, wherein the antioxidant compound is ascorbic acid in an amount from 0.5 to 10% (w/w), and wherein contacting the adduct with the basic aqueous solution is at a pH greater than 9.

17. The process of claim 11, further comprising introducing a surfactant, a pH buffer, a chelating agent, or mixtures thereof during forming of the adduct and/or solubilizing of the adduct.

* * * * *